United States Patent
Aitken

(10) Patent No.: US 8,103,918 B2
(45) Date of Patent: Jan. 24, 2012

(54) CLOCK CONTROL DURING SELF-TEST OF MULTI PORT MEMORY

(75) Inventor: Robert Campbell Aitken, San Jose, CA (US)

(73) Assignee: ARM Limited, Cambridge (GB)

( * ) Notice: Subject to any disclaimer, the term of this patent is extended or adjusted under 35 U.S.C. 154(b) by 538 days.

(21) Appl. No.: 12/076,948

(22) Filed: Mar. 25, 2008

(65) Prior Publication Data
US 2009/0244999 A1 Oct. 1, 2009

(51) Int. Cl.
*G11C 29/00* (2006.01)
(52) U.S. Cl. .................... 714/718; 714/744
(58) Field of Classification Search .............. 714/700, 714/710, 711, 718, 719, 744; 365/200–201
See application file for complete search history.

(56) References Cited

U.S. PATENT DOCUMENTS

| | | | |
|---|---|---|---|
| 6,321,342 B1 * | 11/2001 | Day et al. | 713/600 |
| 6,671,842 B1 * | 12/2003 | Phan et al. | 714/733 |
| 7,783,942 B2 * | 8/2010 | Anzou et al. | 714/718 |

* cited by examiner

*Primary Examiner* — Jeffrey A Gaffin
*Assistant Examiner* — Steve Nguyen
(74) *Attorney, Agent, or Firm* — Nixon & Vanderhye P.C.

(57) ABSTRACT

A multiport memory is provided with multiple data access paths A, B, each having a respective independent clock signal CLKA, CLKB. During self test operation a duplicate clock enable signal DPCLKTESTEN is used to enable one of these clock signals CLKA, CLKB to be used as a shared clock signal by all data access paths A, B. An external memory adjust signal EMAA, EMAB is used to adjust one of these shared clock signals to form a modified shared clock signal for at least one of the data paths being tested. In this way, worst-case scenarios can be more readily investigated comprising clocks with the same frequency but small differences in phase.

23 Claims, 5 Drawing Sheets

CLOCK CONTROL DURING SELF-TEST OF MULTI PORT MEMORY

BACKGROUND OF THE INVENTION

1. Field of the Invention

This invention relates to the field of multiport memories. More particularly, this invention relates to the control of clock signals for driving multiport memories during self-test.

2. Description of the Prior Art

It is known to provide multiport memories having an array of bit storage elements and multiple data access paths permitting multiple concurrent data accesses to be made. These data access paths each have an associated clock signal which drives data accesses on those respective paths. These clock signals are typically asynchronous and independently controlled. An example use of a multiport memory is as a memory shared between two processors with each independently reading data from and writing data to that shared memory using their own data path and with their own clock.

It is important to be able to test memories, including multiport memories, when they are manufactured to ensure that they are free from defects. In order to achieve this, it is known to provide self-test mechanisms, such as built in self-test mechanisms, which write known patterns of data to memories and then read those patterns back to ensure that they were correctly stored and manipulated. Multiport memories provide a particular challenge in exploring the wide range of situations that can arise during their use. It is known to test such multiple port memories by using the same clock signal driven into the different paths to perform simultaneous data access operations via the different data access paths in an effort to stress the memory and provoke a failure should any defect be present.

This approach suffers from the disadvantage that in a significant number of cases the worst-case scenario is not where the clocks for the different data access paths are exactly the same, but rather where there is a small phase difference between those clocks, as this represents the most challenging situation for the memory. A further problem with the known approach of driving the different data access paths with the same clock signal is that generally the normal operational clock path has to be modified to allow for the insertion of the clock signal taken from another data access path. The clock distribution trees within integrated circuits are normally carefully balanced and subject to considerable effort and expertise in order to operate correctly. Interfering with these clock distribution trees, such as by inserting an additional multiplexer to allow self test using the same clock signal, is a complication that can also compromise non-test operation.

A further known feature of existing memory systems is the use of external memory adjust signals. These external memory adjust signals are provided to allow characteristics of the timing control signals for the memory to be adjusted to achieve higher performance and/or more reliable operation. As an example, the timing characteristics of the memory may be set for operation at a given operational voltage, but the memory may be additionally capable of operating at a different voltage, where different timing relationships would produce better results. The external memory adjust signals allow such changes to be made to the timing characteristics, such as the introduction of additional or shorter delays in the self-timing paths used for controlling memory access operations.

SUMMARY OF THE INVENTION

Viewed from one aspect the present invention provides a multiport memory comprising: an array of bit storage cells; and a plurality of data access paths providing multiport access to said array; wherein said plurality of data access paths perform access operations driven by respective clock signals; wherein at least one of said plurality of data access paths is responsive to an external memory adjust signal to adjust one or more access operation timings relative to a respective independent clock signal; said multiport memory further comprising: self-test support circuitry active during self-testing operations upon said multiport memory, said self-test support circuitry comprising: duplicate clock enabling circuitry responsive to a duplicate clock enable signal to enable a clock signal of one of said plurality of access paths to be used as a shared clock signal to drive access operations for a group of access paths; and clock adjusting circuitry responsive to said external memory adjust signal to modify at least one characteristic of said shared clock signal to form a modified shared clock signal as used to drive at least one of said group of access paths while said shared clock signal is used to drive at least one other of said group of access paths.

The present technique recognises that the external memory adjust signals and associated mechanisms are already provided within many multiport memories (which can have two, three or more ports) for normal operational use and these signals and mechanisms can be reused during self-test operation to produce clock signals that are better suited to testing the worst-case scenarios which can arise. The multiport memory is equipped with a duplicate clock enabling signal to control the clock signals of one of the data access path to be shared amongst a group of data access paths, and then one or more external memory adjust signals to be used to tune the characteristics of the shared clock signal to produce a modified clock signal that generates a more realistic worst-case operational scenario.

The respective clock signals may be derived from a common source and be asynchronous at the memory boundary, but in at least some embodiments the respective clock signals are partially or completely independent of one another.

The characteristics of the shared clock signal which can be varied by the memory adjust signal vary considerably. Particular examples are the relative phase between the shared clock signal and the modified shared clock signal and the duty ratio of the modified shared clock signal.

It may be that not all of the data access paths are provided with an external memory adjust signal, but improved flexibility for both. normal operation and self-test operation is achieved when a memory adjust signal is provided for each data access path to provide adjustable timings during normal operation and self-test.

The group of data access paths between which the shared clock signal is shared could be a sub grouping of the total set of access paths provided. However, it is convenient for the group of access paths to comprise all of the access paths which are present for the multiport memory.

The clock signal which is used as the shared clock signal could be fixed. However, improved flexibility is provided by duplicate clock selecting circuitry responsive to a duplicate clock selecting signal to select which one of the independent clock signals is to be used as the shared clock signal.

The self-test control mechanisms could be provided within the multiport memory itself, and the various duplicate clock enable signal, external memory adjust signal, duplicate clock selecting signal etc generated internally of the multiport memory, however, in preferred embodiments a self-test controller is provided external of the multiport memory, and potentially shared with other circuit elements, with these various control signals then being provided as inputs to the multiport memory.

The present technique is particularly useful when the multiport memory is part of a integrated circuit having a plurality of clock distribution trees with at least one of these being shared with another functional block as in this circumstance it is desirable to avoid disruption of the clock distribution trees by self-test mechanisms and operations. The ability to duplicate clock signals within the multiport memory itself and adjust the timings of these within the multiport memory itself is an advantage in this regard.

The clock adjusting circuitry can be performed in a variety of different ways, but a simple and effective way is through the use of a delay line for delaying the shared clock signal to produce the modified clock signal with the delay amount being set by the external memory adjust signal.

Viewed from another aspect the present invention provides a multiport memory comprising: an array of bit storage cells; and a plurality of data access paths providing multiport access to said array; wherein said plurality of data access paths perform access operations driven by respective independent clock signals; wherein at least one of said plurality of data access paths is responsive to an external memory adjust signal to adjust one or more access operation timings relative to a respective independent clock signal; said multiport memory further comprising: self-test support means active during self-testing operations upon said multiport memory, said self-test support means comprising: duplicate clock enabling means responsive to a duplicate clock enable signal for enabling a clock signal of one of said plurality of access paths to be used as a shared clock signal to drive access operations for a group of access paths; and clock adjusting means responsive to said external memory adjust signal for modifying at least one characteristic of said shared clock signal to form a modified shared clock signal as used to drive at least one of said group of access paths while said shared clock signal is used to drive at least one other of said group of access paths.

Viewed from a further aspect the present invention provides a method of operating a multiport memory having an array of bit storage cells and a plurality of data access paths providing multiport access to said array, said method comprising the steps of: performing access operations via said plurality of data access paths driven by respective independent clock signals; and adjusting one or more access operation timings relative to a respective independent clock signal for at least one of said plurality of data access paths is responsive to an external memory adjust signal; wherein during self-testing operations upon said multiport memory, said method further comprising the steps of: in response to a duplicate clock-enable signal, enabling a clock signal of one of said plurality of access paths to be used as a shared clock signal to drive access operations for a group of access paths; and in response to said external memory adjust signal, modifying at least one characteristic of said shared clock signal to form a modified shared clock signal as used to drive at least one of said group of access paths while said shared clock signal is used to drive at least one other of said group of access paths.

The above, and other objects, features and advantages of this invention will be apparent from the following detailed description of illustrative embodiments which is to be read in connection with the accompanying drawings:

DESCRIPTION OF THE PREFERRED EMBODIMENTS

Figure 1:
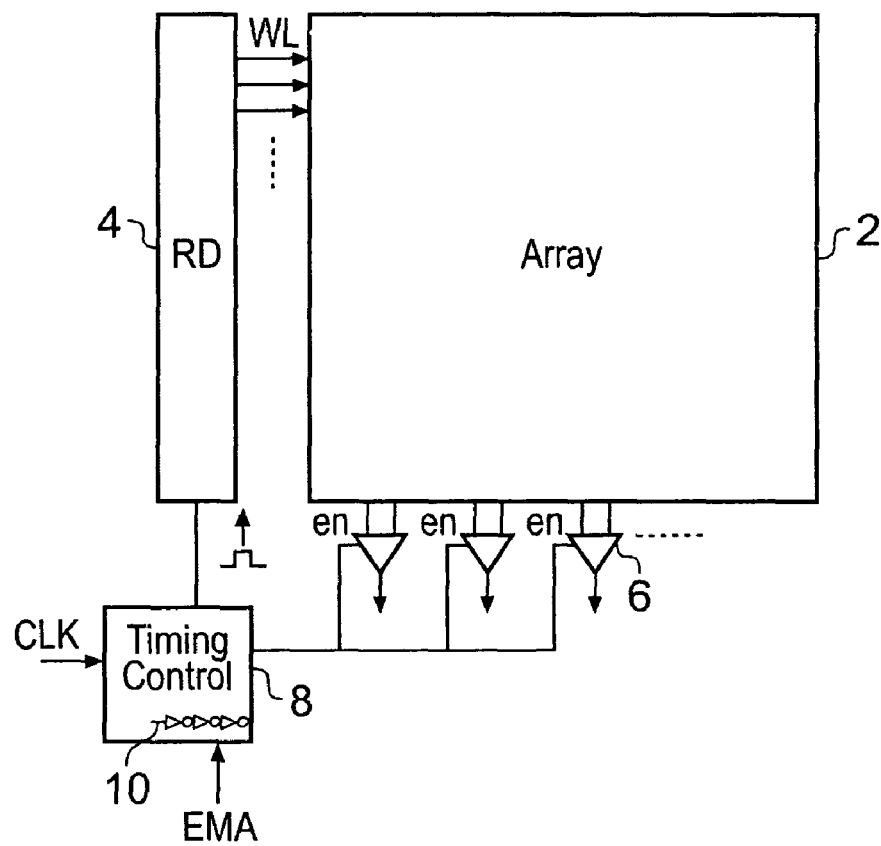
FIG. 1 schematically illustrates a memory and the control of a data access path therein.

FIG. 1 illustrates a memory comprising an array of bit storage cells to that are accessed by activating a word line WL after decoding of an address decoded by a row decoder 4. Sense amplifiers 6 sense voltage differences on bit lines running through the array to generate data bit outputs. A timing control circuit 8 is responsive to a clock signal CLK for the data access path illustrated to generate a pulse which activates the row decoder 4 and a later pulse which activates the sense amplifier 6. A delay line 10 (which may serve to model the propagation delays through the full data access path) is provided to control the timing of the activation of the sense amplifier 6 relative to the pulse activating the row decoder 4, both of which are initiated by an edge within the input clock signal CLK. An external memory adjust signal EMA is supplied to the timing controller 8 to adjust the relative timing of the operations associated with the memory access, i.e. the initiation of the row decode and the activation of the sense amplifier 6.

Figure 2:
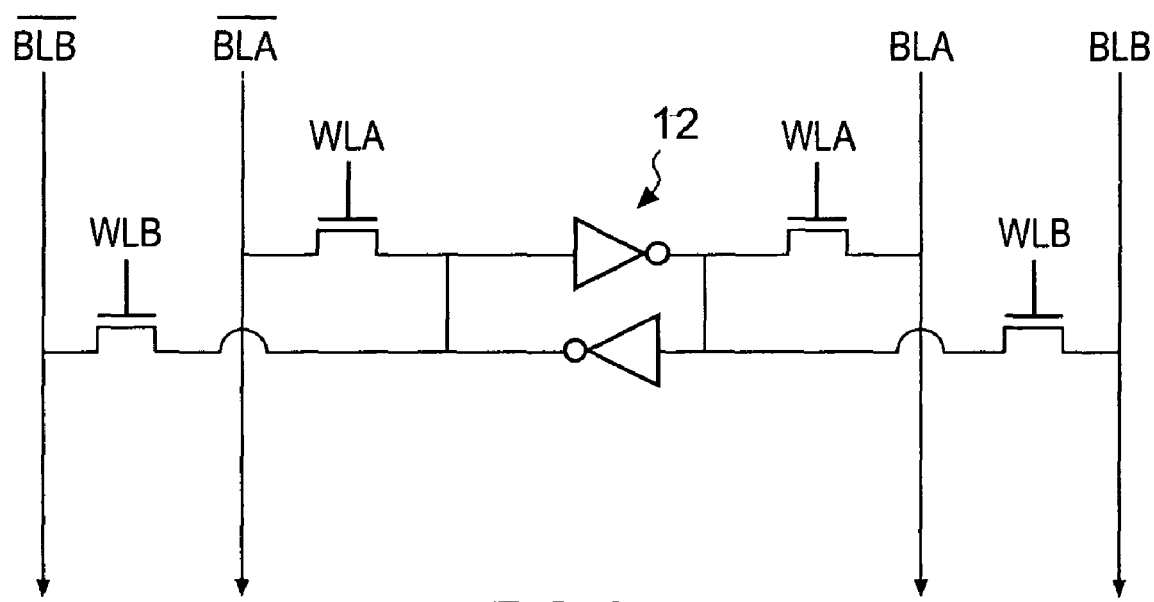
FIG. 2 illustrates a dual port bit storage cell.

FIG. 2 schematically illustrates a bit storage cell 12 with two read ports. These read ports at this level comprise separate word lines WLA, WLB and separate bit line pairs BLA, $\overline{BLA}$ and BLB, $\overline{BLB}$. The relative timing with which the two word lines are activated to read or write to the bit storage cell 12 can be critical and a typical worst-case scenario is when there is a small phase difference between these accesses.

Figure 3:
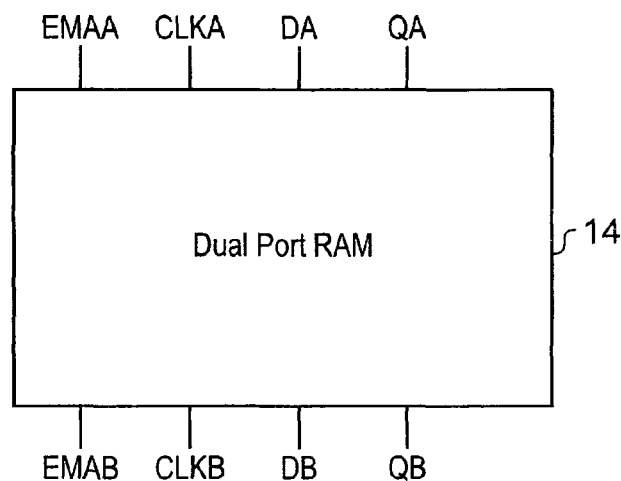
FIG. 3 illustrates a dual port random access memory with control signals input thereto.

FIG. 3 illustrates a multiport memory 14 which contains an array of dual-port bit storage cells 12 as shown in FIG. 2. The respective clock signals for these two data access paths are CLKA and CLKB. Each of these data access paths is also provided with its own external memory adjust signal, namely EMAA and EMAB.

Figure 4:
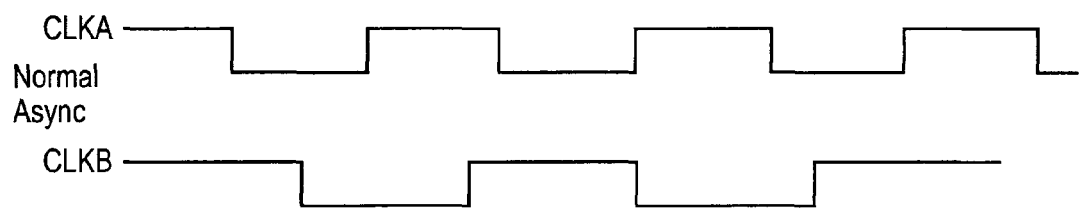
FIG. 4 illustrates respective independent clock signals for different data access paths to the memory of FIG. 3.

FIG. 4 illustrates an asynchronous relationship between the respective clock signals CLKA and CLKB for use during normal operation. These clock signals can have different frequencies, phases and duty ratios. These relationships can also vary dynamically e.g. one of the clock signals being speeded up or slowed down.

Figure 5:
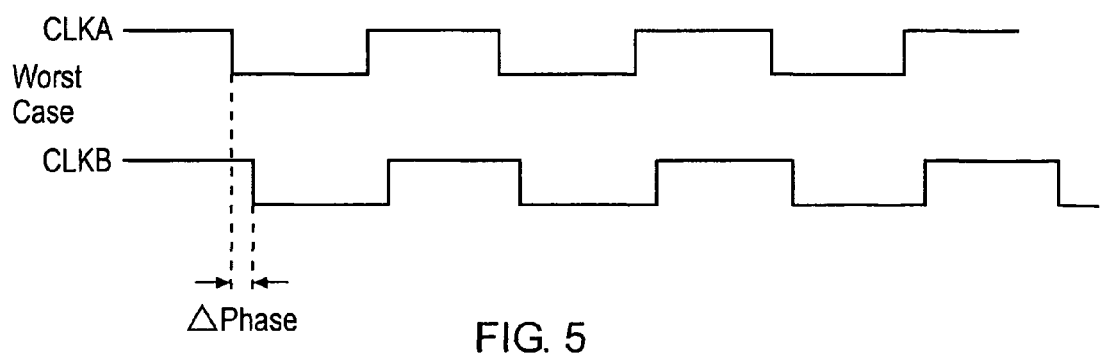
FIG. 5 illustrates a worst-case relative timing between clock signals of two data access paths.

FIG. 5 schematically illustrates one example form of a worst-cased relative timing of the clock signals for the two different data access paths. In this case the two clock signals have the same frequency and duty ratio, but have a small phase difference therebetween. This can provoke errors in operation in the dual-port bit storage cells 12 if these are defective.

Figure 6:
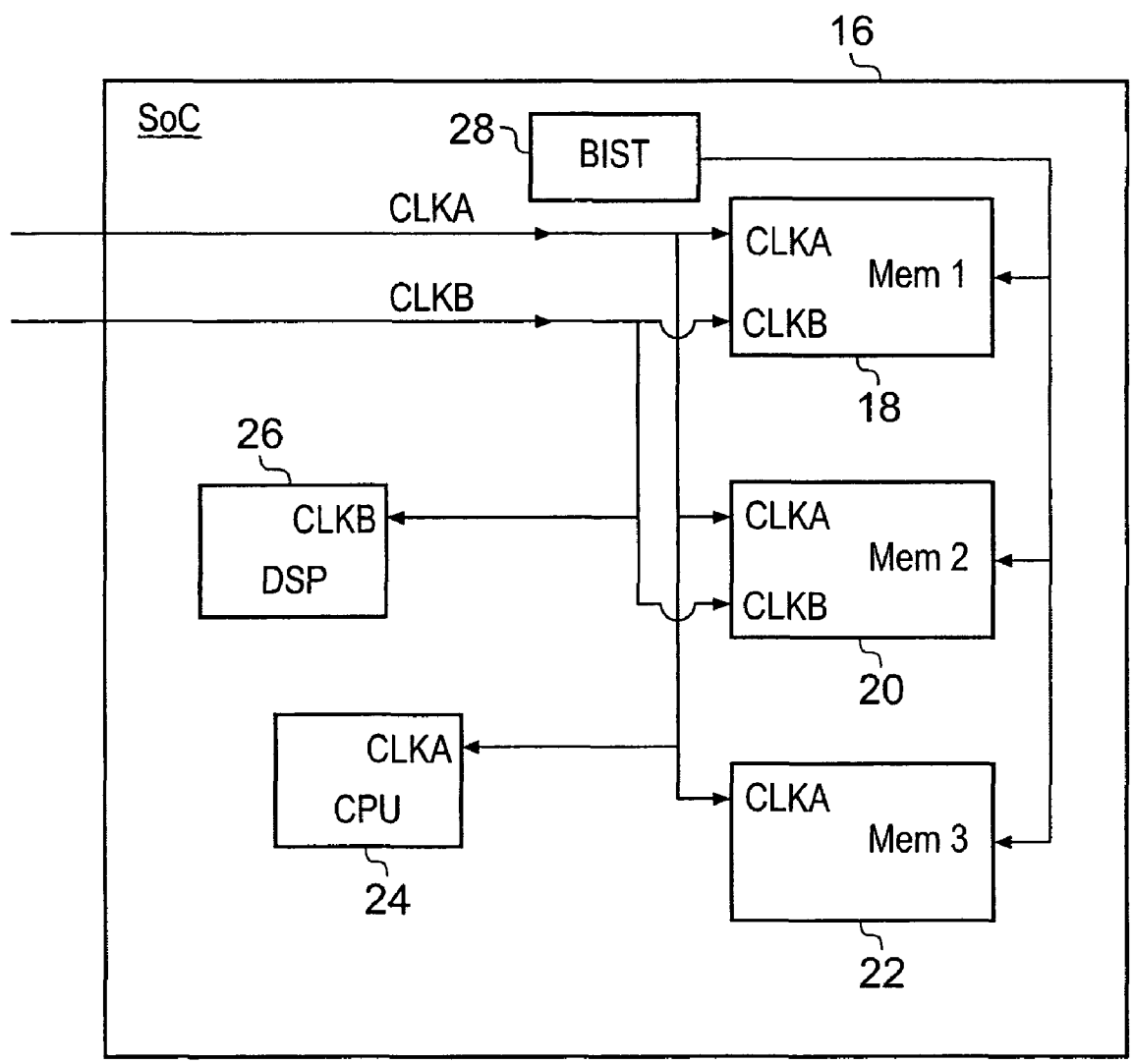
FIG. 6 illustrates the use of multiport memories within a system-on-chip integrated circuit and multiple clock distribution trees.

FIG. 6 illustrates a system-on-chip integrated circuit 16 comprising two dual port memories 18, 20 both having respective data access paths clocked by clock signals CLKA and CLKB. A third memory 22 is single port and is clocked by one clock signal CLKA. A central processing unit 24 is clocked by CLKA whilst a digital signal processor 26 is clocked by CLKB. It will be seen that the clock distribution trees for the two clock signals CLKA and CLKB are complex and can represent a significant amount of the design effort in producing a system-on-chip integrated circuit such as that illustrated in FIG. 6. Accordingly, measures which avoid interfering with these clock distribution trees for the purpose of self-test are desirable.

Figure 8:
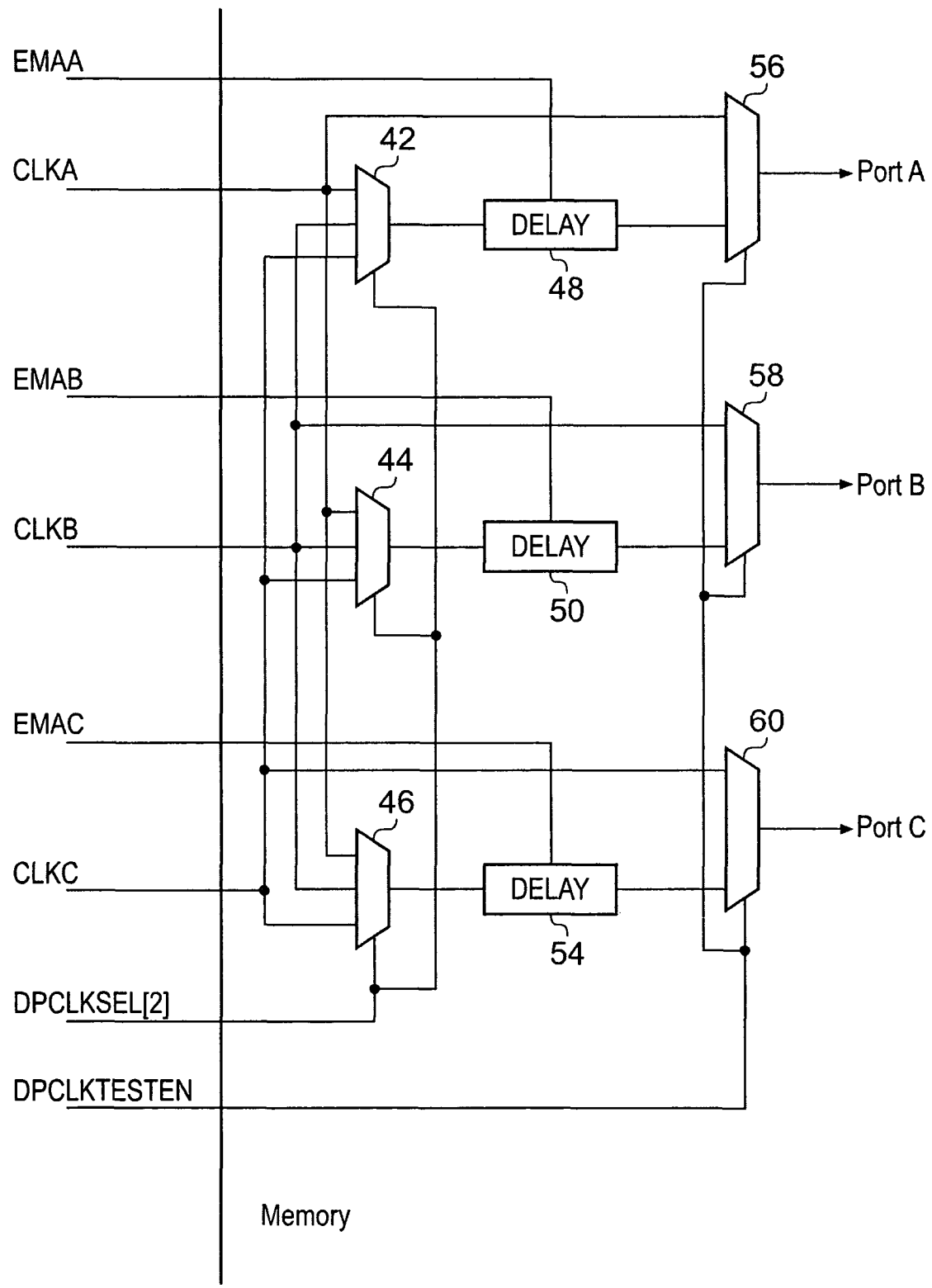
FIG. 8 illustrates clock replication and modification within a three port memory.

FIG. 8 illustrates clock manipulation mechanisms suitable for use with three port memories. It will be appreciated that the present techniques are applicable to multi-port memories in general and are not restricted to dual port memories. As illustrated in FIG. 3 there are normally three clock signals CLKA, CLKB and CLKC supplied from their respective sources. These sources can be fully independent clock sources or sources in which one clock is derived from another clock in some fixed or variable manner but is treated by the memory itself as having no particular relationship with other of the clocks.

Figure 7:
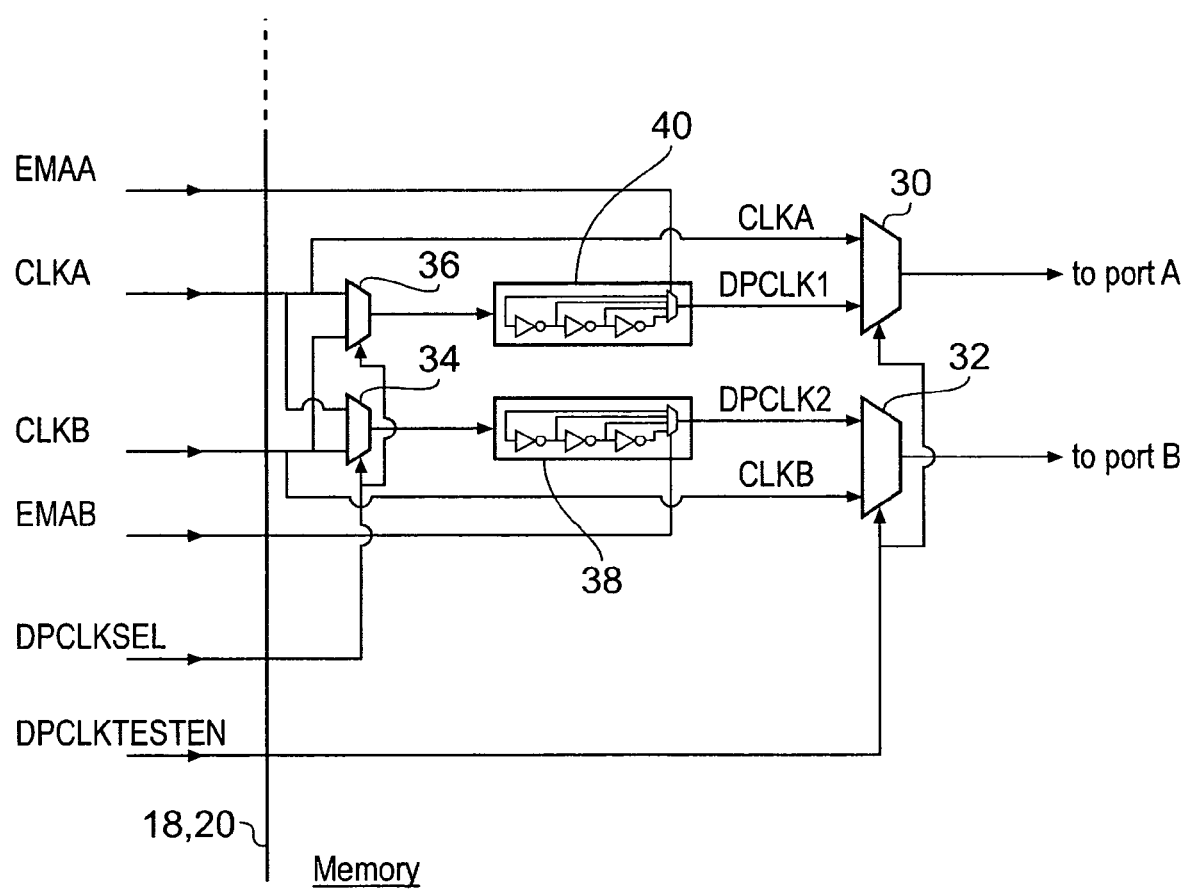
FIG. 7 illustrates clock duplication and clock modification within a two port memory.

The system of FIG. 8 is similar to that of FIG. 7. A replicated clock selecting signal DPCLKSEL is in this case a two-bit signal since it must specify one of the three clock signals CLKA, CLKB and CLKC which is to be used to derive the other of the clock signals. This replicated clock selecting signal DPCLKSEL controls the switching of multiplexers 42, 44 and 46. The output from these multiplexers 42, 44, 46 are fed to respective clock signal adjusting circuitry 48, 50, 52 where delay values specified by external memory adjust signals EMAA, EMAB and EMAC are applied. The multiplexers 56, 58 and 60 finally select either the originally intended clock signals or the replicated and adjusted clock signals for output to control the respective ports within the memory.

Illustrated in FIG. 6 is a built-in-self test (BIST) unit 28, which is coupled to each of the memories 18, 20, 22. This BIST unit 28 drives test patterns into the memories 18, 20, 22 and reads those patterns out from the memories to try and identify any defective portions thereof. Defective portions can be substituted using inbuilt redundancies within the memories 18,20,22 or it may be that the SoC is treated as defective and rejected.

FIG. 7 illustrates mechanisms by which the BIST unit 28 of FIG. 6 can manipulate the clock signals CLKA and CLKB being supplied to the dual-port memories 18, 20 to form clock signals for the respective data access paths corresponding to the worst case relationship shown in FIG. 5. In addition to the normal inputs to the dual-port memory 18, 20 formed of the external memory adjust signals EMAA and EMAB and the clock signals CLKA, and CLKB there are also provided a duplicate clock enable signal DPCLKTESTEN and a duplicate clock select signal DPCLKSEL. The duplicate clock enable signal DPCLKTESTEN is used to control multiplexers 30, 32 which serve as duplicate clock enabling circuitry by selecting the clock signals CLKA and CLKB respectively for direct use in the different data access paths A, B, or alternatively the shared clock signal and modified shared clock signals (which has been subject to modification). When the shared clock signals are being used as selected by the multiplexers 30, 32, the duplicate clock select signal DPCLKSEL is used to switch multiplexers 34, 36 to select either the clock signal CLKA or the clock signal CLKB to serve as the shared clock signal. Once one of these two input clock signals has been selected as the shared clock signal, clock adjusting circuitry 38, 40, in the form of a programmable delay line where the delay is set by the external memory adjust signals EMAA and EMAB, is used to form at least one modified shared clock signal DPCLK1, DPCLK2. It may be that only one of the delay lines 38, 40 is active since this will be sufficient to introduce a relative phase shift. It will be appreciated that further clock adjusting circuitry may be provided and used to adjust other characteristics of the shared clock signals, such as the duty ratios of one or both of these signals as desired to provoke particular worst-case connections for the self-test operations on a memory under test.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A multiport memory comprising:
an array of bit storage cells;
a plurality of data access paths providing multiport access to said array, wherein said plurality of data access paths perform access operations during normal operations driven by respective clock signals, and at least one of said plurality of data access paths is responsive to an external memory adjust signal to adjust one or more access operation timings relative to a respective independent clock signal; and
self-test support circuitry active during self-testing operations upon said multiport memory, said self-test support circuitry comprising:
duplicate clock enabling circuitry, responsive to a duplicate clock enable signal, configured to enable a clock signal of one of said plurality of access paths used during said normal operations to be used as a shared clock signal to drive access operations for a group of access paths during said self-testing operations; and
clock adjusting circuitry, responsive to said external memory adjust signal, configured to modify at least one characteristic of said shared clock signal to form a modified shared clock signal as used to drive at least one of said group of access paths during said self-testing operations while said shared clock signal is used to drive at least one other of said group of access paths during said self-testing operations.

2. A multiport memory as claimed in claim 1, wherein said respective clock signals are respective independent clock signals.

3. A multiport memory as claimed in claim 1, wherein said at least one characteristic comprises relative phase between said shared clock signal and said modified shared clock signal.

4. A multiport memory as claimed in claim 1, wherein said at least one characteristic comprises a duty ratio of said modified shared clock signal.

5. A multiport memory as claimed in claim 1, wherein, when not during self-test, each of said plurality of data access paths is responsive to a respective external memory adjust signal to adjust one or more access operation timings relative to a corresponding respective independent clock signal.

6. A multiport memory as claimed in claim 1, wherein said group of access paths comprises all of said plurality of access paths.

7. A multiport memory as claimed in claim 1, wherein said self-test support circuitry further comprises duplicate clock selecting circuitry responsive to a duplicate clock selecting signal to select which one of said respective independent clock signals is used as said shared clock signal.

8. A multiport memory as claimed in claim 1, wherein said duplicate clock enable signal and said external memory adjust signal are received as input signals to said multiport memory.

9. A multiport memory as claimed in claim 7, wherein said duplicate clock selecting signal is received as an input signal to said multiport memory.

10. A multiport memory as claimed in claim 1, wherein said multiport memory is part of an integrated circuit having a plurality of clock distribution trees to distribute said respective independent clock signals, at least one of said independent clock signals being shared with another functional block within said integrated circuit.

11. A multiport memory as claimed in claim 1, wherein said clock adjusting circuitry comprises a delay line for delaying said shared clock signal by a delay amount selected in dependence upon said external memory adjust signal to form said modified shared clock signal.

12. A multiport memory comprising:
an array of bit storage cells;
a plurality of data access paths providing multiport access to said array; wherein said plurality of data access paths perform access operations during normal operations driven by respective clock signals, and at least one of said plurality of data access paths is responsive to an external memory adjust signal to adjust one or more access operation timings relative to a respective independent clock signal; and
self-test support means active during self-testing operations upon said multiport memory, said self-test support means comprising:
duplicate clock enabling means, responsive to a duplicate clock enable signal, for enabling a clock signal of one of said plurality of access paths used during said normal operations to be used as a shared clock signal to drive access operations for a group of access paths during said self-testing operations; and
clock adjusting means, responsive to said external memory adjust signal, for modifying at least one characteristic of said shared clock signal to form a modified shared clock signal as used to drive at least one of said group of access paths during said self-testing operations while said shared clock signal is used to drive at least one other of said group of access paths during said self-testing operations.

13. A method of operating a multiport memory having an array of bit storage cells and a plurality of data access paths providing multiport access to said array, said method comprising the steps of:
performing access operations via said plurality of data access paths driven during normal operations by respective clock signals;
adjusting one or more access operation timings relative to a respective independent clock signal for at least one of said plurality of data access paths in response to an external memory adjust signal;
during self-testing of said multiport memory and in response to a duplicate clock enable signal, enabling a clock signal of one of said plurality of access paths during said normal operations to be used as a shared clock signal to drive access operations for a group of access paths during said self-testing operations; and
in response to said external memory adjust signal, modifying at least one characteristic of said shared clock signal to form a modified shared clock signal as used to drive at least one of said group of access paths during said self-testing operations while said shared clock signal is used to drive at least one other of said group of access paths during said self-testing operations.

14. A method as claimed in claim 13, wherein said respective clock signals are respective independent clock signals.

15. A method as claimed in claim 13, wherein said at least one characteristic comprises relative phase between said shared clock signal and said modified shared clock signal.

16. A method as claimed in claim 13, wherein said at least one characteristic comprises a duty ratio of said modified shared clock signal.

17. A method as claimed in claim 13, wherein, when not during said self-testing operations, each of said plurality of data access paths is responsive to a respective external memory adjust signal to adjust one or more access operation timings relative to a corresponding respective independent clock signal.

18. A method as claimed in claim 13, wherein said group of access paths comprises all of said plurality of access paths.

19. A method as claimed in claim 13, further comprising, in response to a duplicate clock selecting signal, selecting which one of said respective independent clock signals is used as said shared clock signal.

20. A method as claimed in claim 13, wherein said duplicate clock enable signal and said external memory adjust signal are received as input signals to said multiport memory.

21. A method as claimed in claim 19, wherein said duplicate clock selecting signal is received as an input signal to said multiport memory.

22. A method as claimed in claim 13, wherein said multiport memory is part of an integrated circuit having a plurality of clock distribution trees to distribute said respective independent clock signals, at least one of said independent clock signals being shared with another functional block within said integrated circuit.

23. A method as claimed in claim 13, wherein said clock adjusting circuitry comprises a delay line for delaying said shared clock signal by a delay amount selected in dependence upon said external memory adjust signal to form said modified shared clock signal.

\* \* \* \* \*